(12) United States Patent
Murthy et al.

(10) Patent No.: US 11,610,889 B2
(45) Date of Patent: Mar. 21, 2023

(54) ARSENIC-DOPED EPITAXIAL, SOURCE/DRAIN REGIONS FOR NMOS

(71) Applicant: INTEL CORPORATION, Santa Clara, CA (US)

(72) Inventors: Anand Murthy, Portland, OR (US); Ryan Keech, Portland, OR (US); Nicholas G. Minutillo, Hillsboro, OR (US); Ritesh Jhaveri, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1014 days.

(21) Appl. No.: 16/145,375

(22) Filed: Sep. 28, 2018

(65) Prior Publication Data

US 2020/0105754 A1    Apr. 2, 2020

(51) Int. Cl.
*H01L 27/092* (2006.01)
*H01L 29/66* (2006.01)
(Continued)

(52) U.S. Cl.
CPC .. *H01L 27/0924* (2013.01); *H01L 21/823821* (2013.01); *H01L 21/823871* (2013.01); *H01L 29/0673* (2013.01); *H01L 29/0847* (2013.01); *H01L 29/1037* (2013.01); *H01L 29/167* (2013.01); *H01L 29/4966* (2013.01); *H01L 29/518* (2013.01); *H01L 29/66545* (2013.01);
(Continued)

(58) Field of Classification Search
CPC ......... H01L 27/0924; H01L 21/823821; H01L 21/823871; H01L 29/0673; H01L 29/0847; H01L 29/1037; H01L 29/66545; H01L 29/785; H01L 2029/7858
See application file for complete search history.

(56) References Cited

U.S. PATENT DOCUMENTS

| 2011/0169065 A1* | 7/2011 | Cheng | H01L 27/1203 438/155 |
| 2013/0154016 A1* | 6/2013 | Glass | H01L 29/785 438/285 |

(Continued)

*Primary Examiner* — Monica D Harrison
*Assistant Examiner* — Andre C Stevenson
(74) *Attorney, Agent, or Firm* — Schwabe, Williamson & Wyatt, P.C.

(57) ABSTRACT

Techniques are disclosed for providing an integrated circuit structure having NMOS transistors including an arsenic-doped interface layer between epitaxially grown source/drain regions and a channel region. The arsenic-doped interface layer may include, for example, arsenic-doped silicon (Si:As) having arsenic concentrations in a range of about 1E20 atoms per cm$^3$ to about 5E21 atoms per cm$^3$. The interface layer may have a relatively uniform thickness in a range of about 0.5 nm to full fill where the entire source/drain region is composed of the Si:As. In cases where the arsenic-doped interface layer only partially fills the source/drain regions, another n-type doped semiconductor material can fill remainder (e.g., phosphorus-doped III-V compound or silicon). The use of a layer having a high arsenic concentration can provide improved NMOS performance in the form of abrupt junctions in the source/drain regions and highly conductive source/drain regions with negligible diffusion of arsenic into the channel region.

15 Claims, 9 Drawing Sheets

(51) Int. Cl.
*H01L 29/51* (2006.01)
*H01L 29/78* (2006.01)
*H01L 29/08* (2006.01)
*H01L 29/49* (2006.01)
*H01L 29/167* (2006.01)
*H01L 21/8238* (2006.01)
*H01L 29/06* (2006.01)
*H01L 29/10* (2006.01)

(52) U.S. Cl.
CPC .... *H01L 29/785* (2013.01); *H01L 2029/7858* (2013.01)

(56) References Cited

U.S. PATENT DOCUMENTS

| | | | |
|---|---|---|---|
| 2018/0040729 A1* | 2/2018 | Meiser | H01L 29/66696 |
| 2018/0277521 A1* | 9/2018 | Or-Bach | H01L 23/5225 |
| 2018/0286962 A1* | 10/2018 | Bao | H01L 29/66545 |
| 2019/0148527 A1* | 5/2019 | More | H01L 29/0847 257/401 |

* cited by examiner

ARSENIC-DOPED EPITAXIAL, SOURCE/DRAIN REGIONS FOR NMOS

BACKGROUND

Planar transistor technologies such as CMOS ("Complementary Metal Oxide Semiconductor") have evolved in accordance with Moore's law toward denser designs (i.e., larger number of transistors per unit area). Traditionally, this evolution has been achieved by scaling the dimensions of the individual transistors and associated parameters to accommodate the increasing densities. However, reduction of transistor size is limited by the practicalities of reliable fabrication techniques for achieving practical yield as well as intrinsic device performance barriers arising from the underlying physics of such devices at small scales. For example, short channel effects ("SCEs") play a major role in device performance as transistors are scaled to smaller and smaller dimensions.

As the channel length decreases or becomes shorter, the depletion regions of the source and drain come closer together and make the transistor threshold voltage (VT) a function of the length of the channel. This is referred to as $V_T$ roll-off. $V_T$ also becomes a function of drain to source voltage $V_{DS}$. As the $V_{DS}$ is increased, the depletion regions increase in size, and a considerable amount of charge is depleted by the $V_{DS}$. The gate voltage required to form the channel is then lowered, and thus, the $V_T$ decreases with an increase in $V_{DS}$. This effect is sometimes referred to as drain induced barrier lowering (DIBL).

BRIEF DESCRIPTION OF THE DRAWINGS

FIGS. 4D'-4H' illustrate a variation to example structures of FIGS. 4D-4H where the source/drain regions include an undercut, in accordance with some embodiments. The illustrated cross-sectional views in FIGS. 4A-4H (as well as FIGS. 4D'-4H') are along the body of channel material and perpendicular to the gate line to illustrate the structures formed.

Figure 1:
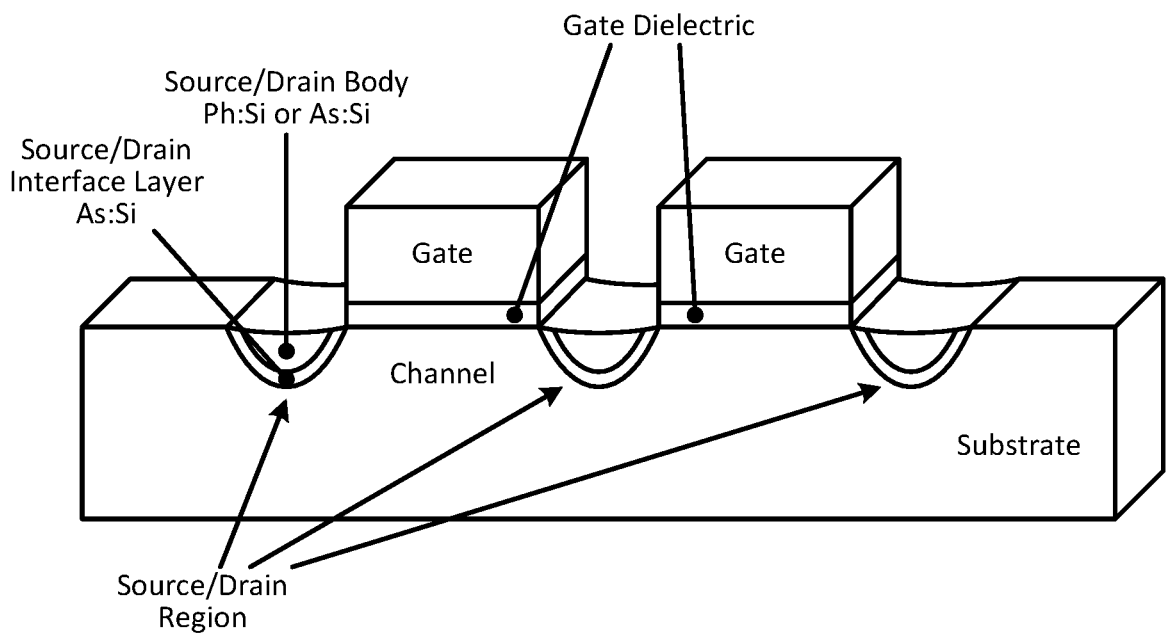
FIG. 1 illustrates a perspective view of an example integrated circuit structure including epitaxial source/drain regions that include an arsenic-doped interface layer, in accordance with an embodiment of the present disclosure.

These and other features of the present embodiments will be understood better by reading the following detailed description, taken together with the figures herein described. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

An integrated circuit structure is disclosed having NMOS transistors including an arsenic-doped interface layer between epitaxially grown source/drain regions and a channel region. Given a source/drain region recess or trench, an arsenic-doped interface layer or so-called liner is epitaxially deposited or grown on the bottom and sides of the source/drain region recess, according to an embodiment. In some such embodiments, the arsenic-doped interface layer includes arsenic-doped silicon (Si:As) having arsenic concentrations in a range of about 1E20 atoms per $cm^3$ to about 5E21 atoms per $cm^3$, or some other relatively high arsenic concentration based on the end use or target application. In any such case, the Si:As film has a relatively uniform thickness or may completely fill the source/drain recess. For instance, in some such embodiments, the Si:As film has a relatively uniform thickness in a range of about 0.5 nm to 25 nm (e.g., 2 to 10 nm). Alternatively, the Si:As film may completely or otherwise substantially fill the source/drain region recess (e.g., where source/drain recess is 90% or more filled with the Si:As film). In the case where the arsenic-doped film completely fills the source/drain region recess, the resulting source/drain region is a single layer or single stack structure composed of the arsenic-doped film. That is, the arsenic-doped film comprises both the interface layer and the body of the source/drain region. Conversely, in cases where the arsenic-doped film does not completely fill the source/drain region recess (e.g., in the case of partial Si:As fill), a compositionally different n-type doped semiconductor can be deposited to complete the fill. For instance, in some example embodiments where the source/drain recess is partially filled with partial Si:As, phosphorus-doped silicon (Si:P) can be deposited onto a top surface of the Si:As film to fill or complete the source/drain region portion above the Si:As film. In this case, the resulting source/drain region is a bi-layer or multilayer-stack structure composed of a first layer of Si:As film and a second layer of Si:P fill. That is, the Si:As film comprises the interface layer of the source/drain region and the Si:P fill makes up the body of the source/drain region. In such cases, the thickness of the second layer or body portion can vary from one embodiment to the next but in some cases is, for example, equal to or greater than the thickness of the first layer (e.g., first layer fills up to about the first third of the source/drain recess, and second layer fills the remaining two thirds of the source/drain recess). In a more general sense, the thickness of the arsenic-doped first layer is sufficient to inhibit dopant diffusion into the channel region, and the remainder of the source/drain region fill can be either additional arsenic-doped semiconductor or another n-type doped semiconductor. As will be appreciated in light of this disclosure, the relatively low diffusivity of arsenic in silicon provides for abrupt junctions in the source/drain region, which promote gate length scaling. In addition, the low diffusivity allows the Si:As film to provide highly conductive source/drain regions with negligible diffusion of arsenic into the channel region (e.g., improved off-state leakage and higher drive current). Further, the compatibility of Si:As with high anneal temperatures further provides improved Si:P contact resistivity, dopant activation, and/or net source/drain region resistivity in cases where the source/drain body includes Si:P, for example. In any case, the arsenic-doped interface layer between the source/drain regions and the channel region improve short channel effects and improve the effective gate length of a resulting transistor.

General Overview

When forming a transistor, epitaxially grown Si:P source/drain regions can provide competitive "bulk" resistivity and contact resistance within the source/drain regions for NMOS devices. However, such phosphorus-doped source/drain regions tend to cause significant phosphorus diffusion into the channel region during thermal annealing necessary for dopant activation and/or other anneal processes post source/drain deposition. The phosphorus diffusion results in a large diffusion tail in the channel region. This in turn leads to high off-state leakage and reduced conductivity at the source/drain, which are undesirable for physical scaling and manifest a degradation in overall transistor performance.

Thus, and in accordance with various embodiments of the present disclosure, techniques are provided for integrated circuits configured with NMOS devices having an arsenic-doped interface layer between epitaxially grown source/drain regions and the channel region. For instance, the arsenic-doped interface layer may be a part of the epitaxial source/drain region or may effectively be the entire epitaxial source/drain region. Numerous configurations will be apparent.

In some embodiments, the arsenic-doped interface layer includes Si:As having arsenic concentrations in a range of about 1E20 atoms per $cm^3$ to about 5E21 atoms per $cm^3$, or some other or some other relatively high arsenic concentration based on the end use or target application. In an example embodiment, the Si:As has an arsenic concentration on the order of about 1E21 atoms per $cm^3$. In some such embodiments, the Si:As film is deposited with a relatively uniform thickness in a range of about 0.5 nm to 25 nm (e.g., at least about 0.5 nm, such as 2 nm to 15 nm, or 2 nm to 10 nm, or at an otherwise suitable thickness to inhibit diffusion of dopant from source/drain region into channel region). In a more general sense, the arsenic-doped film may fill any percentage of the source/drain recess, so as to be effective in inhibiting dopant diffusion into the channel region, up to a full fill where the source/drain region recess is completely filled with the arsenic-doped film. Other suitable semiconductor materials can be used to fill any remaining portion of the source/drain recess. In any such cases, note that the overall source/drain structure may extend above the source/drain recess opening (so-called raised source/drain regions), according to some embodiments.

In the case of full Si:As fill, the resulting source/drain region is a single layer structure composed of the epitaxial Si:As film. That is, the interface layer and the body of the resulting source/drain region is composed of Si:As (the arsenic-doped interface layer material). Conversely, in the case of partial Si:As fill, Si:P can be deposited onto a top surface of the Si:As film (e.g., arsenic-doped interface layer) to fill or complete the source/drain region recess above the Si:As film, according to an embodiment. In this example case, the resulting source/drain region is a bi-layer or multilayer-stack structure composed of or otherwise comprising a first layer of epitaxial Si:As film and a second layer of Si:P fill. That is, Si:P comprises the source/drain region body above the Si:As interface layer. Note that in such cases of partial Si:As fill, the interface layer of the source/drain region is compositionally different than the body of the source/drain region. The Si:As to Si:P fill ratio can be tuned to optimize or otherwise achieve a desired resistivity, mobility, and/or diffusivity of the source/drain region to improve performance, for instance. To this end, the respective thicknesses of the first and second source/drain layers can be set accordingly, with the primary goal being to inhibit dopant migration from source/drain region into channel region. The second layer can have any number of configurations, with respect to semiconductor materials, dopants, dopant concentration, grading of one or more components, when used in conjunction with an arsenic-doped first layer suitable for inhibiting dopant migration.

In some embodiments, the source/drain region includes silicon co-doped with arsenic and phosphorus. In some such embodiments, arsenic and phosphorus concentrations can each be in a range of about 1E19 atoms per $cm^3$ to about 1E22 atoms per $cm^3$. In an example embodiment, the co-doped silicon has an arsenic and phosphorus concentration on the order of about 5E20 atoms per $cm^3$ each. For instance, in such embodiments, the silicon co-doped with arsenic and phosphorus is epitaxially deposited in the source/drain region recess to fill the source/drain region recess. Co-doping arsenic and phosphorus with silicon in this manner provides the benefits of the improved electrical activation associated with phosphorus and the relatively low diffusivity associated with arsenic, for instance. The arsenic and phosphorus concentrations can be tuned to optimize or otherwise achieve a desired resistivity, mobility, and/or diffusivity of the source/drain region to improve performance, for instance.

In some embodiments, the source/drain region includes silicon co-doped with various combinations of arsenic, phosphorus, and/or carbon. In some such embodiments including carbon as one of the co-dopants, the concentration of carbon is in a range of about 0.05 atomic percent to about 3 atomic percent. In an example embodiment, the concentration of carbon is in a range of about 0.05 atomic percent to about 2 atomic percent. In another example embodiment, carbon concentration is in a range of about 2.5E19 atoms per $cm^3$ to about 1E21 atoms per $cm^3$. For instance, in such embodiments, the silicon co-doped with arsenic, phosphorus, and/or carbon is epitaxially deposited in the source/drain region recess to fill the source/drain region recess. As will be appreciated, as a smaller atom, incorporating carbon substitutionally such that the carbon becomes part of the lattice of the epitaxially grown film results in a tensile stress created in the channel region. In addition to the benefits noted above, the resulting tensile stress enhances the electron mobility of the n-channel transistors, which improves the overall transport properties and provides higher drive currents. The arsenic, phosphorus, and carbon concentrations can be tuned to optimize or otherwise achieve a desired resistivity, active carrier concentrations, and/or stress within the source/drain region and, specifically tensile strain on the channel region for improved performance.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate the presence of an arsenic-doped epitaxial source/drain region as described herein. For example, TEM can be useful to show a cross section of the device structure, including an arsenic-doped silicon film in the source/drain region. In another example, x-ray crystallography can be useful to illustrate the crystal quality of the arsenic-doped silicon liner having high arsenic concentrations in the source/drain region. In some embodiments, the techniques described herein may be detected based on the benefits derived from their use, which include abrupt junctions in the source/drain region, improved resistivity, mobility, and/or diffusivity of the source/drain region in NMOS devices, improved gate length, and/or other improved device performance. Numerous configurations and variations will be apparent in light of this disclosure.

Materials that are compositionally different as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally different may further refer to two materials that have different crystallographic orientations. For instance, (110) silicon is different from (100) silicon. Creating a stack of different orientations could be accomplished, for instance, with blanket wafer layer transfer.

Note that the use of "source/drain" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

It is noted that designations such "above" or "below" or "top" or "bottom" or "top side" or "bottom side" are not intended to necessarily implicate a limitation as to orientation of the embodiments described herein. Rather, such terminology is simply used in a relative sense to consistently describe a structure as it exists in any one particular orientation and as illustrated herein.

System Architecture

FIG. 1 illustrates a perspective view of an example integrated circuit structure including epitaxial source/drain regions that include an arsenic-doped interface layer, in accordance with an embodiment of the present disclosure. The integrated circuit structure illustrated in FIG. 1 is of a planar transistor configuration. As shown in FIG. 1, the integrated structure includes two gate structures and source/drain regions to respective sides of each gate structure. Note that two gate structures and three source/drain regions are shown for ease of illustration, and any number of gate structures and corresponding source/drain regions may be present, such as one, two, five, ten, hundreds, thousands, millions, and so forth, as can be understood based on this disclosure. In this example embodiment, the illustrated gate structures may be NMOS gates.

Figure 2:
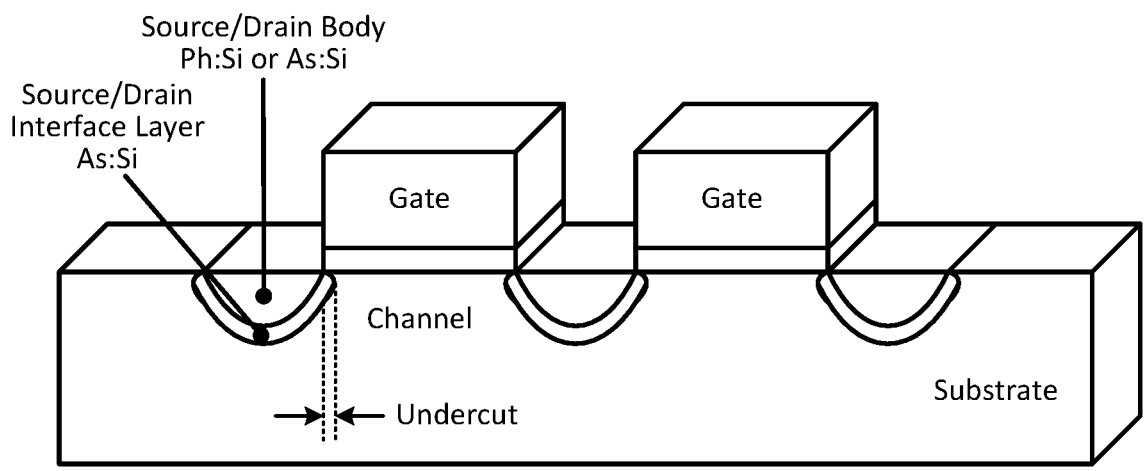
FIG. 2 illustrates a perspective view of an example integrated circuit structure including epitaxial source/drain regions that undercut a gate structure and that include an arsenic-doped interface layer, in accordance with another embodiment of the present disclosure.

As can be seen, the gate structures are formed on (or over) a substrate, such as a bulk silicon substrate. A gate dielectric is below each gate structure and is between the gate structure and a corresponding channel region. In cases where the integrated structure is fabricated using a gate-first process, source/drain region recesses are formed adjacent the channel region, after the final gate structure is provided (e.g., tungsten gate electrode, hafnium dioxide gate dielectric, and silicon nitride gate spacers). In other cases where the integrated structure is fabricated using a gate-last process, however, source/drain region recesses are formed adjacent the channel region, after a dummy gate structure is provided (e.g., polysilicon gate electrode, silicon dioxide gate dielectric, and silicon nitride gate spacers). In any case, as shown in FIG. 1, the source/drain region recesses may extend under gate spacers (not shown) on respective sides of the gate structure, but not undercut the gate structure such that the recesses do not extend under the gate structure. In other embodiments, as shown in FIG. 2, the source/drain region recesses may undercut the gate structure such that the recesses include tip regions that extend under the gate structure (e.g., under at least one of the gate electrode and/or gate dielectric). Any suitable etch can be used to form the source/drain region recesses, including wet and/or dry etches, isotropic and/or anisotropic etches, and selective etch schemes, as will be appreciated. The previously described Si:As is then epitaxially deposited into the source/drain region recesses to provide a conformal arsenic-doped interface layer at the bottom of the source/drain regions. In cases of full Si:As fill, the Si:As material fills and provides the source/drain regions. In such cases, the Si:As material (Si:As film) comprises both the interface layer and the body of the provided source/drain regions. Otherwise, in cases of partial Si:As fill, the previously described Si:P is deposited onto a top surface of the Si:As film (e.g., the arsenic-doped interface layer) to provide the source/drain regions. In such cases, the Si:As material (Si:As film) comprises the interface layer of the provided source/drain regions, and the Si:P fill above the Si:As film comprises the body of the provided source/drain regions. An example bi-layer source/drain region structure is illustrated in FIGS. 1 and 2 where the source/drain region includes an Si:As source/drain region interface layer and either an Si:As or a Si:P source/drain region body. In any case, Si:As, Si:P, and/or any other previously noted example source/drain materials (e.g., silicon co-doped with arsenic and phosphorus or silicon co-doped with various combinations of arsenic, phosphorus, and carbon) may be provisioned with in situ doping. In some cases, the source/drain material deposition grows out of a trench or otherwise from the underlying semiconductor material to provide faceted or otherwise raised source/drain regions.

Methodology

Figure 3:
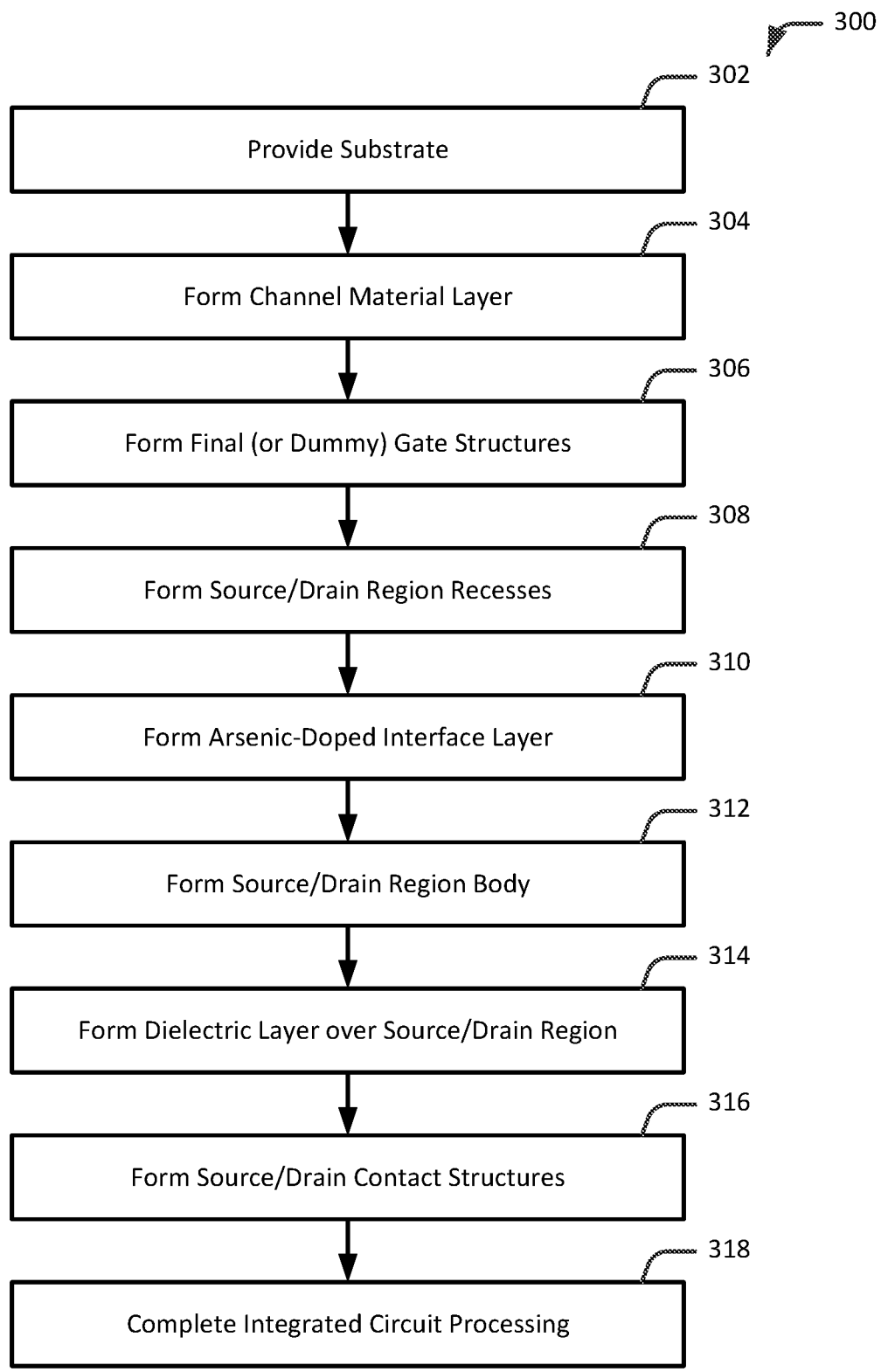
FIG. 3 is a flow diagram illustrating an example process for forming an integrated circuit including arsenic-doped epitaxial source/drain regions, in accordance with an embodiment of the present disclosure.
Figure 4A:
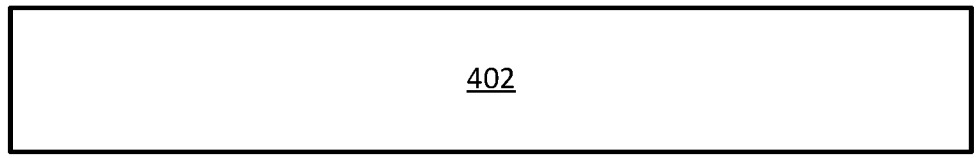
FIGS. 4A-4H illustrate cross-sectional views of integrated circuit structures formed when carrying out the process of FIG. 3, in accordance with an embodiment of the present disclosure.
Figure 4B:
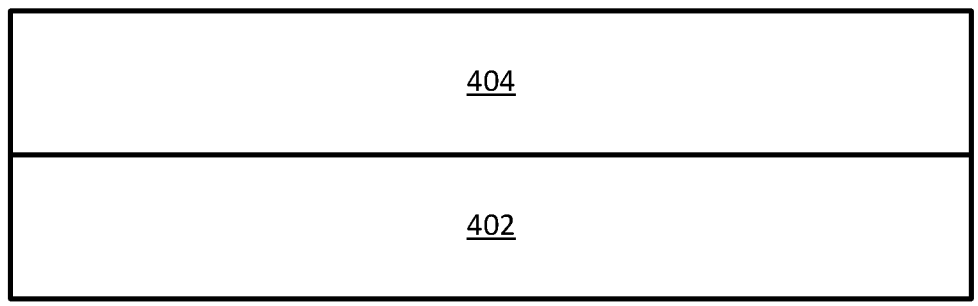
Figure 4C:
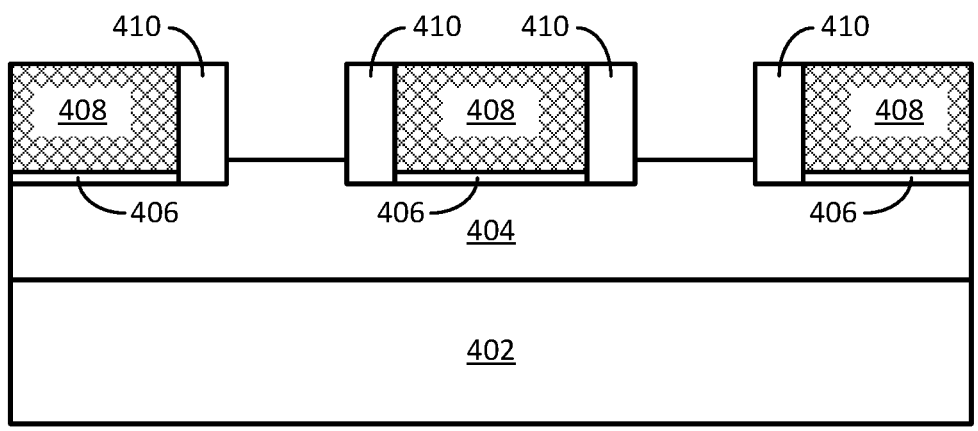
Figure 4D:
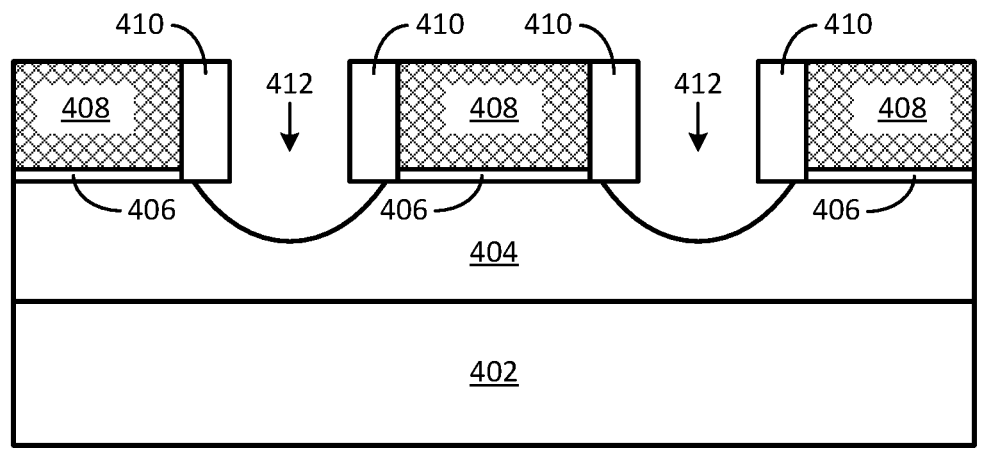
Figure 4D:
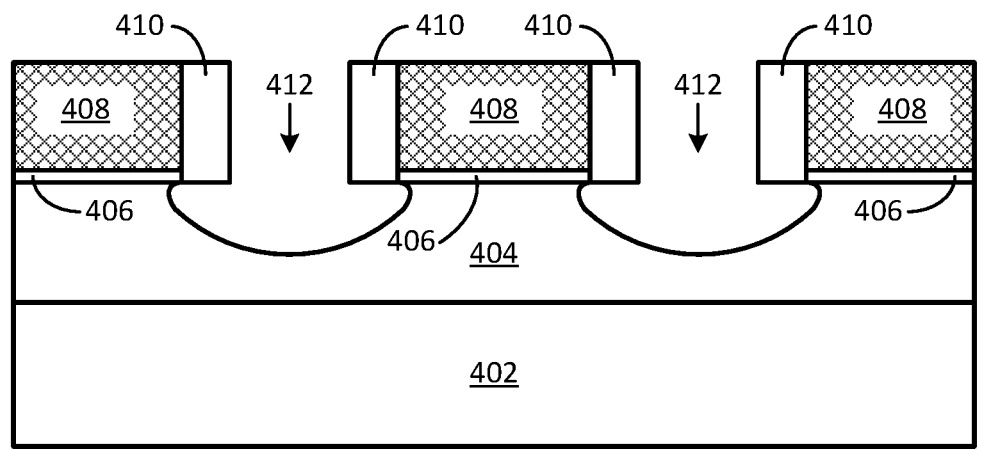

FIG. 3 is a flow diagram illustrating an example process 300 for forming an integrated circuit including arsenic-doped epitaxial source/drain regions, in accordance with an embodiment of the present disclosure. FIGS. 4A-4H illustrate cross-sectional views of integrated circuit structures formed when carrying out the process of FIG. 3, in accordance with an embodiment of the present disclosure. FIGS. 4D'-4H' illustrate a variation to example structures of FIGS. 4D-4H where the source/drain regions include an undercut, in accordance with some embodiments. The illustrated cross-sectional views in FIGS. 4A-4H (as well as FIGS. 4D'-4H') are along the body of channel material and perpendicular to the gate line to illustrate the structures formed. Concurrent reference to FIG. 2 and FIGS. 4A-4H and 4D'-4H' will facilitate explanation.

A multitude of different transistor devices can benefit from the techniques described herein, which includes, but is not limited to, various field-effect transistors (FETs), such as metal-oxide-semiconductor FETs (MOSFETs), tunnel FETs (TFETs), and Fermi filter FETs (FFFETs) (also known as tunnel source MOSFETs), to name a few examples. For example, the techniques can be used to benefit an n-channel MOSFET (NMOS) device, which may include a source-channel-drain scheme of n-p-n or n-i-n, where 'n' indicates n-type doped semiconductor material, 'p' indicates p-type doped semiconductor material, and 'i' indicates intrinsic/undoped semiconductor material (which may also include nominally undoped semiconductor material, including dopant concentrations of less than 1E16 atoms per $cm^3$, for example), in accordance with some embodiments.

In addition, the techniques can be used to benefit transistors including a multitude of configurations, such as planar and/or non-planar configurations, where the non-planar configurations may include finned or FinFET configurations (e.g., dual-gate or tri-gate), gate-all-around (GAA) device configurations (e.g., employing one or more nanowires or nanoribbons), or some combination thereof (e.g., a beaded-fin configuration), to provide a few examples. For instance, process 300 describes a technique for a finned configuration. Further, the techniques are used in some embodiments to benefit complementary transistor circuits, such as complementary MOS (CMOS) circuits, where the techniques may be used to benefit one or more of the included n-channel transistors making up the CMOS circuit. Other example transistor devices that can benefit from the techniques described herein include few to single electron quantum transistor devices, in accordance with some embodiments. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Note that deposition or epitaxial growth techniques (or more generally, additive processing) where described herein can use any suitable techniques, such as chemical vapor deposition (CVD), physical vapor deposition (PVD), atomic layer deposition (ALD), and/or molecular beam epitaxy (MBE), to provide some examples. Also note that etching techniques (or more generally, subtractive processing) where described herein can use any suitable techniques, such as wet and/or dry etch processing which may be isotropic (e.g., uniform etch rate in all directions) or anisotropic (e.g., etch rates that are orientation dependent), and which may be non-selective (e.g., etches all exposed materials at the same or similar rates) or selective (e.g., etches different materials that are exposed at different rates). Further note that other processing may be used to form the integrated circuit structures described herein as will be apparent in light of this disclosure, such as hardmasking, patterning or lithography (via suitable lithography techniques, such as, e.g., photolithography, extreme ultraviolet lithography, x-ray lithography, or electron beam lithography), planarizing or polishing (e.g., via chemical-mechanical planarization (CMP) processing), doping (e.g., via ion implantation, diffusion, or including dopant in the base material during formation), and annealing, to name some examples.

In embodiments where semiconductor material described herein includes dopant, the dopant is any suitable n-type and/or p-type dopant that is known to be used for the specific semiconductor material. For instance, in the case of group IV semiconductor materials (e.g., Si, SiGe, Ge), p-type dopant includes group III atoms (e.g., boron, gallium, aluminum), and n-type dopant includes group V atoms (e.g., phosphorus, arsenic, antimony). In the case of group III-V semiconductor materials (e.g., GaAs, InGaAs, InP, GaP), p-type dopant includes group II atoms (e.g., beryllium, zinc, cadmium), and n-type dopant includes group VI atoms (e.g., selenium, tellurium). However, for group III-V semiconductor materials, group VI atoms (e.g., silicon, germanium) can be employed for either p-type or n-type dopant, depending on the conditions (e.g., formation temperatures). In embodiments where dopant is included in semiconductor material, the dopant can be included at quantities in the range of 1E16 to 1E22 atoms per $cm^3$, or higher, for example. In some embodiments, dopant is included in semiconductor material in a quantity of at least 1E16, 1E17, 1E18, 5E18, 1E19, 5E19, 1E20, 5E20, or 1E21 atoms per $cm^3$ and/or of at most 1E22, 5E21, 1E21, 5E20, 1E20, 5E19, 1E19, 5E18, or 1E18 atoms per $cm^3$, for example. In some embodiments, semiconductor material described herein is undoped/intrinsic, or includes relatively minimal dopant, such as a dopant concentration of less than 1E16 atoms per $cm^3$, for example. Note that semiconductor material described herein has a monocrystalline or single-crystal structure (also referred to as a crystalline structure) unless otherwise explicitly stated (e.g., unless referred to as having a polycrystalline or amorphous structure).

With reference to process 300 of FIG. 3, at block 302, a substrate is provided for processing. FIG. 4A illustrates such an example substrate 402. In some embodiments, substrate 402 is: a bulk substrate including group IV semiconductor material (such as Si, Ge, and/or SiGe), group III-V semiconductor material, and/or any other suitable material(s) as will be apparent in light of this disclosure; an X on insulator (XOI) structure where X is one of the aforementioned materials (e.g., group IV and/or group III-V semiconductor material) and the insulator material is an oxide material or dielectric material or some other electrically insulating material, such that the XOI structure includes the electrically insulating material layer between two semiconductor layers; or some other suitable multilayer structure where the top layer includes one of the aforementioned semiconductor materials (e.g., group IV and/or group III-V semiconductor material). In embodiments where substrate 402 (or at least the top layer of the substrate, where substrate 402 is a multilayer structure) includes a semiconductor material, the semiconductor material may include dopant or the semiconductor material may be undoped/intrinsic. In some embodiments, substrate 402 can be an insulator or dielectric substrate, such as a glass substrate. For ease of discussion, in some embodiments, it is assumed that the structures described herein are formed above (and in some cases, directly on) a bulk silicon substrate. Thus, in such embodiments, substrate 402 is a bulk silicon substrate (that either does or does not include dopant), which may be desirable due to the relatively low cost and availability of such bulk silicon substrates.

In some embodiments, substrate 402 includes a surface crystalline orientation described by a Miller index of (100), (110), or (111), or its equivalents. Although substrate 402 is shown in the figures as having a thickness (dimension in the vertical direction) similar to other layers for ease of illustration, in some instances, substrate 402 is relatively much thicker than the other layers, such as having a thickness in the range of 1 to 950 microns (or in the sub-range of 20 to 800 microns), for example, or any other suitable thickness value or range as will be apparent in light of this disclosure. In some embodiments, substrate 402 includes a multilayer structure including two or more distinct layers (that may or may not be compositionally different). In some embodiments, substrate 402 includes grading (e.g., increasing and/ or decreasing) of one or more material concentrations throughout at least a portion of substrate 402. In some embodiments, substrate 402 is used for one or more other IC devices, such as various diodes (e.g., light-emitting diodes (LEDs) or laser diodes), various transistors (e.g., MOSFETs, TFETs), various capacitors (e.g., MOSCAPs), various microelectromechanical systems (MEMS), various nanoelectromechanical systems (NEMS), various radio frequency (RF) devices, various sensors, and/or any other suitable semiconductor or IC devices, depending on the end use or target application. Accordingly, in some embodiments, the structures described herein are included in system-on-chip (SoC) applications.

At block 304, a channel material layer is formed on the substrate. FIG. 4B illustrates an example resulting structure after formation of a channel material layer 404 on substrate 402, and polishing. Note that channel material layer 404 is also referred herein to as simply a channel layer or a body (of channel material). Regardless, channel layer or body 402 is referred to as such because it includes a region in which the channel of carrier travel resides when the transistor device is in the on-state. Recall that channel layer 402 may be formed using either a blanket deposition and patterning of the layer or by forming the layer by depositing it in a fin-shaped trench (where the trench is between insulator material, such as two STI regions).

In some embodiments, channel layer 404 includes semiconductor material. In some such embodiments, the semiconductor material included in channel layer 404 may or may not include dopant (n-type and/or p-type dopant). In some embodiments, semiconductor material included in channel layer 404 may include one or more of silicon, germanium, tin, indium, gallium, aluminum, phosphorus, arsenic, nitrogen, antimony, or bismuth, for example. In some embodiments, channel layer 404 includes a multilayer structure of two or more sub-layers including compositionally different material. For instance, in gate-all-around (GAA) embodiments, channel layer 404 is a multilayer stack including one or more sacrificial layers and one or more final layers, where the sacrificial layers are to be later removed (e.g., during replacement gate processing) to release the final layers in the channel region, thereby allowing the gate structure to be formed around those one or more final layers (which may be referred to as nanowires or nanoribbons). In some embodiments, channel layer 404 includes grading (e.g., increasing and/or decreasing) of one or more material concentrations throughout at least a portion of channel layer 404.

In some embodiments, channel layer 404 has a thickness (dimension in the vertical direction) in a range of about 5-200 nm (or in a subrange of 5-25 nm, 5-50 nm, 5-100 nm, 10-25 nm, 10-50 nm, 10-80 nm, 10-100 nm, 10-200 nm, 20-80 nm, 20-100 nm, 20-200 nm, 40-80 nm, 40-120 nm, 40-200 nm, 50-100 nm, 50-200 nm, or 100-200 nm) or greater, or within any other suitable range or having any other suitable value as will be apparent in light of this disclosure. In some embodiments, channel layer 404 has a thickness of at least 5 nm, 10 nm, 15 nm, 20 nm, 25 nm, 50 nm, 80 nm, 100 nm, 120 nm, or 150 nm, and/or at most 200 nm, 150 nm, 120 nm, 100 nm, 80 nm, 50 nm, or 25 nm, for example. In some embodiments, channel layer 404 is used for a planar configuration, where the channel only resides in/near the top surface of channel layer 404, such as where the final gate structure described herein is formed only above channel layer 404. In other embodiments, channel layer 404 is used for non-planar configurations, where the channel resides in/near multiple sides of channel layer 404. For instance, in some non-planar embodiments, channel layer or body 404 is a fin or includes a fin-like shape, where the fin body is between portions of the final gate structure. Such configurations may be referred to as having a finFET or tri-gate structure. In some non-planar embodiments, a gate-all-around configuration is employed where the final gate structure is around channel layer or body 404, such that body 404 is a nanowire or nanoribbon, for example. Non-planar configurations are described in more detail herein with reference to FIGS. 3, 4A-4H, and 4D'-4H', for example. However, it will be appreciated that the figures and accompanying description provided herein generally apply to both planar and non-planar configurations, unless explicitly stated otherwise.

In some embodiments, channel layer 404 includes germanium. In some such embodiments where channel layer 404 includes germanium, the germanium concentration may be in the range of about 30 to 100 atomic percent, for example. Further, in some such embodiments where channel layer 404 includes germanium, the body may also include silicon and/or tin. In another example embodiment, channel layer 404 includes indium, such as in a group III-V semiconductor compound of InAs, InGaAs, InAlAs, InP, or InGaN, to provide some example compounds. In another example embodiment, channel layer 404 includes gallium, such as in a group III-V semiconductor compound of GaAs, InGaAs, GaN, AlGaN, InGaN, GaP, or GaSb, to provide some example compounds. In another example embodiment, channel layer 404 includes arsenic, such as in a group III-V semiconductor compound of InAs, InGaAs, GaAs, AlAs, or InAlAs, to provide some example compounds.

At block 306, final (or dummy) gate structure(s) are formed on the channel material layer. FIG. 4C illustrates an example resulting structure after formation of example final (or dummy) gate structures on channel material layer 404. Note that three gate structures are shown for ease of illustration, and any number of gate structures may be present, such as one, two, four, five, ten, hundreds, thousands, millions, and so forth, as can be understood based on this disclosure. Also note that there is one complete gate structure shown in the middle, while partial gate structures are shown on the left and right sides of the complete gate structure. However, the relevant description of the gate structure provided herein is equally applicable to all three structures, and so, their features are identified with the same numbers. The gate structure or gate stack in the example structure of FIG. 4C is shown as a final gate structure that will be in the final integrated circuit structure, and includes a gate dielectric 406 and a gate electrode 408. In such embodiments, the processing includes a gate-first process flow, where the final gate structure is formed prior to performing the source and drain region processing. Alternatively, in some embodiments, dummy gate structures can be initially formed in a gate-last process flow. In the case of a gate-last approach, a sacrificial (or dummy) gate structure serves as a placeholder for the final gate stack. The dummy gate structure permits the formation of spacers and/or placement of the source and drain regions on opposite sides of the gate stack, after which, the dummy gate can be replaced with the final gate stack. For instance, the dummy gate structure can include a dummy gate dielectric (e.g., dummy oxide material) and a dummy gate electrode (e.g., dummy polysilicon material) to be used for the replacement gate process, where those dummy materials are intended to be sacrificial such that they can be later removed and replaced by the final gate structure. The use of a gate-last process approach avoids exposing the final gate stack to potentially damaging processing conditions, such as elevated temperatures, since the final device gate is placed at the end of the process.

Regardless of whether the final gate structure is formed using a gate-first or a gate-last process, the gate structure includes gate dielectric 406 and gate electrode 408. In some embodiments, the gate structure, whether final or dummy, may be formed by blanket depositing the final or dummy gate materials and then patterning the materials to the desired gate structure. However, any suitable techniques can be used to form the final and/or dummy gate structures, in accordance with some embodiments. In some embodiments, gate dielectric 406 includes an oxide (e.g., silicon dioxide), nitride (e.g., silicon nitride), high-k dielectric, low-k dielectric, and/or any other suitable material as will be apparent in light of this disclosure. Examples of high-k dielectrics include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. Examples of low-k dielectrics include, for instance, fluorine-doped silicon dioxide, carbon-doped silicon dioxide, porous silicon dioxide, porous carbon-doped silicon dioxide, spin-on organic polymeric dielectrics (e.g., polytetrafluoroethylene, benzocyclobutene, polynorbornenes, polyimide), spin-on silicon based polymeric dielectrics (e.g., hydrogen silsesquioxane, methylsilsesquioxane), to provide some examples. In some embodiments, an annealing process is carried out on gate dielectric 406 to improve its quality when, for example, high-k dielectric material is employed.

In some embodiments, gate dielectric 406 includes oxygen. In some such embodiments where gate dielectric 406 includes oxygen, gate dielectric 406 also includes one or more other materials, such as one or more of hafnium, silicon, lanthanum, aluminum, zirconium, tantalum, titanium, barium, strontium, yttrium, lead, scandium, tantalum, zinc, lithium, or niobium. For instance, gate dielectric 406 may include hafnium and oxygen (e.g., in the form of hafnium oxide or hafnium silicon oxide), or gate dielectric 406 may include silicon and oxygen (e.g., in the form of silicon dioxide, hafnium silicon oxide, or zirconium silicon oxide), in accordance with some embodiments. In some embodiments, gate dielectric 406 includes nitrogen. In some such embodiments where gate dielectric 406 includes nitrogen, gate dielectric 406 may also include one or more other materials, such as silicon (e.g., silicon nitride) for instance. In some embodiments, gate dielectric 406 includes silicon and oxygen, such as in the form of one or more silicates (e.g., titanium silicate, tungsten silicate, niobium silicate, and silicates of other transition metals). In some embodiments, gate dielectric 406 includes oxygen and nitrogen (e.g., silicon oxynitride or aluminum oxynitride).

In some embodiments, gate dielectric 406 includes a multilayer structure, including two or more compositionally distinct layers. For example, a multilayer gate dielectric can be employed to obtain desired electrical isolation and/or to help transition from channel layer 404 to gate electrode 408, in accordance with some embodiments. In an example embodiment, a multilayer gate dielectric has a first layer nearest channel layer 404 that includes oxygen and one or more materials included in channel layer 404 (such as silicon and/or germanium), which may be in the form of an oxide (e.g., silicon dioxide or germanium oxide), and the multilayer gate dielectric also has a second layer farthest from channel layer 404 (and nearest gate electrode 408) that includes at least one high-k dielectric (e.g., hafnium and oxygen, which may be in the form of hafnium oxide or hafnium silicon oxide). In some embodiments where a multilayer gate dielectric is employed, the structure includes a first sub-layer that is only between gate electrode 408 and channel layer 404, and a second sub-layer that is both between gate electrode 408 and channel layer 330 as well as along sidewalls of gate electrode 408 (e.g., between gate electrode 408 and spacers 410). This may be achieved via replacement gate processing, where the final gate dielectric 406 is formed along sidewalls of dielectric material after the dummy gate structure is removed. In some embodiments, gate dielectric 406 includes grading (e.g., increasing and/or decreasing) the content/concentration of one or more materials through at least a portion of gate dielectric 406, such as the oxygen content/concentration within gate dielectric 406.

In some embodiments, gate dielectric 406 has a thickness in the range of about 1-30 nm (or in a sub-range of 1-5 nm, 1-10 nm, 1-15 nm, 1-20 nm, 1-25 nm, 2-5 nm, 2-10 nm, 2-15 nm, 2-20 nm, 2-25 nm, 2-30 nm, 3-8 nm, 3-12 nm, 5-10 nm, 5-15 nm, 5-20 nm, 5-25 nm, 5-30 nm, 10-20 nm, 10-30 nm, or 20-30 nm) or greater, for example, or within any other suitable range or having any other suitable value as will be apparent in light of this disclosure. In some embodiments, the thickness of gate dielectric 406 is at least 1 nm, 2 nm, 3 nm, 5 nm, 10 nm, 15 nm, 20 nm, or 25 nm, and/or at most 30 nm, 25 nm, 20 nm, 15 nm, 10 nm, 8 nm, or 5 nm, for example. Note that the thicknesses described herein for gate dielectric 406 relate at least to the dimension between channel layer/body 404 and gate electrode 408 (e.g., at least the dimension in the vertical direction). In embodiments where gate dielectric 406 is also on a sidewall of each of gate spacers 410, then the thickness is also the dimension between gate electrode 408 and each of spacers 410, as can be understood based on this disclosure. In some embodiments, the thickness of gate dielectric 406 is selected, at least in part, based on the desired amount of isolation between channel layer 330 and gate electrode 408.

In some embodiments, gate dielectric 406 provides means for insulating gate electrode 408 from channel layer/body 404. In some embodiments, the characteristics of gate dielectric 406 are selected based on desired electrical properties. For instance, some embodiments employ a relatively thicker gate dielectric (e.g., at least 5 nm or 10 nm in thickness) and/or relatively lower-k dielectric material for the gate dielectric, such as silicon dioxide or low-k dielectric material (e.g., where the dielectric constant, k, is less than that of silicon dioxide, so less than 3.9) to help reduce parasitic capacitance issues caused between adjacent gate electrodes or between gate electrodes and adjacent source/drain contacts, for example. However, in other embodiments, hi-k dielectric material is desired as such material can provide desired electrical properties for some gate configurations.

In some embodiments, gate electrode 408 includes one or more metals, such as one or more of aluminum, tungsten, titanium, tantalum, copper, nickel, gold, platinum, ruthenium, or cobalt, for example. In some embodiments, gate electrode 408 includes carbon and/or nitrogen, such as in combination with one or more of the aforementioned metals, for example. For instance, in some embodiments, gate electrode 408 includes titanium and nitrogen (e.g., titanium nitride), or tantalum and nitrogen (e.g., tantalum nitride), such as in a liner layer that is in direct contact with the gate dielectric, for example. Thus, in some embodiments, gate electrode 408 includes one or more metals that may or may not include one or more other materials (such as carbon and/or nitrogen). In some embodiments, gate electrode 408 includes a multilayer structure, including two or more compositionally distinct layers. For instance, in some such embodiments, one or more work function layers are employed, such as one or more metal-including layers that are formed with desired electrical characteristics. Further, in some such embodiments, the one or more metal-including layers include tantalum and/or titanium, which may also include nitrogen (e.g., in the form of tantalum nitride or titanium nitride). In some embodiments, a bulk metal structure is formed on and between a conformal layer (such as a liner layer), where the bulk metal structure includes compositionally distinct material from the conformal/liner layer. In some such embodiments, the conformal/liner layer can be "U" shaped, for example.

In some embodiments, gate electrode 408 includes a resistance reducing metal layer between a bulk metal structure and the gate dielectric, for instance. Example resistance reducing metals include, for instance one or more of nickel, titanium, titanium with nitrogen (e.g., titanium nitride), tantalum, tantalum with nitrogen (e.g., tantalum nitride), cobalt, gold, gold with germanium (e.g., gold-germanium), nickel, platinum, nickel with platinum (e.g., nickel-platinum), aluminum, and/or nickel with aluminum (e.g., nickel aluminum), for instance. Example bulk metal structures include one or more of aluminum, tungsten, ruthenium, copper, or cobalt, for instance. In some embodiments, gate electrode 408 includes additional layers, such as one or more layers including titanium and nitrogen (e.g., titanium nitride) and/or tantalum and nitrogen (e.g., tantalum nitride), which can be used for adhesion and/or liner/barrier purposes, for example. In some embodiments, the thickness, material, and/or deposition process of sub-layers within a multilayer gate electrode are selected based on a target application, such as whether the gate electrode is to be used with an n-type body of channel layer 404 or a p-type body of channel layer 404. In some embodiments, gate electrode 408 provides means for changing the electrical attributes of the adjacent channel layer/body 404 when a voltage is applied to gate electrode 408.

In some embodiments, gate electrode 408 has a thickness (dimension in the vertical direction in the view of FIG. 4C) in the range of about 10-100 nm (or in a sub-range of 10-25 nm, 10-50 nm, 10-75 nm, 20-30 nm, 20-50 nm, 20-75 nm, 20-100 nm, 30-50 nm, 30-75 nm, 30-100 nm, 50-75 nm, or 50-100 nm) or greater, for example, or within any other suitable range or having any other suitable value as will be apparent in light of this disclosure. In an embodiment, gate electrode 408 has a thickness that falls within the sub-range of 20-40 nm. In some embodiments, the thickness of gate electrode 408 is at least 10 nm, 15 nm, 20 nm, 25 nm, 30 nm, 40 nm, or 50 nm and/or at most 100 nm, 50 nm, 40 nm, 30 nm, 25 nm, or 20 nm, for example. In some embodiments, gate electrode 408 includes grading (e.g., increasing and/or decreasing) the content/concentration of one or more materials through at least a portion of the structure.

FIG. 4C also illustrates sidewall spacers 410, referred to generally as gate spacers (or simply, spacers), adjacent to respective sides of gate stack 408, in the example structure. Such spacers 410 can be formed using any suitable techniques, such as depositing the material of spacers 410 and performing spacer pattern and etch processing, for example. In some embodiments, spacers 410 can be used to help determine the gate length and/or channel length (dimensions in the horizontal direction), and/or to help with replacement gate processing, for example. In some embodiments, spacers 410 include any suitable oxide (e.g., silicon dioxide), nitride (e.g., silicon nitride), high-k dielectric, low-k dielectric, and/or any other suitable electrically insulating material as will be apparent in light of this disclosure. In some embodiments, spacers 410 include silicon, oxygen, nitrogen, and/or carbon. For instance, in some embodiments, spacers 410 include silicon dioxide, silicon nitride, silicon oxynitride, or carbon-doped silicon dioxide (or other carbon-doped oxides). In some embodiments, it is desired to select material for spacers 410 that has a low dielectric constant and a high breakdown voltage. In some embodiments, spacers 410 include a multilayer structure (e.g., a bilayer structure where the sub-layers are laterally adjacent to each other in the horizontal direction), even though it is illustrated as a single layer in the example structure of FIG. 4C. In some embodiments, spacers 410 and gate dielectric 406 do not include a distinct interface as shown in FIG. 4C, particularly where spacers 410 and gate dielectric 406 include the same material, for example.

At block 308, source/drain region recesses are formed in the channel material layer. FIG. 4D illustrates an example resulting structure after formation of example source/drain region recesses 412 in channel material layer 404, according to an embodiment. In some embodiments, source/drain region recess 412 can undercut gate electrodes 408 on respective sides of source/drain region recess 412, as illustrated in FIG. 4D'. Note that the designation source/drain is used herein to refer to either a source or a drain or both, as the regions may be similar in the end structure but be differentiated based on how the device is electrically connected. For instance, this may be the case for MOSFET devices, such as NMOS and PMOS devices, where the source and drain regions of a given device includes the same material and doping scheme. However, in some embodiments, the source and drain regions may be configured differently, such as for TFET devices, where the source and drain regions of a given device are oppositely-type doped. In addition, the shape of the regions for a given device may differ, in some embodiments. Regardless, for ease of description, each of the source and drain are individually referred to herein as simply source/drain.

In some embodiments, source/drain region recesses 412 are formed in locations where source/drain regions for NMOS devices are to be formed. Such source/drain region recesses 412 can be formed using any suitable patterning and etch schemes (e.g., wet and/or dry etching) or selective etch schemes. For instance, source/drain region recesses 412 can be formed by applying a selective anisotropic etch to etch in a vertically downward direction into channel layer 404 followed by a selective isotropic etch, for example. If PMOS source/drain regions are to exist on the substrate, note that such source/drain regions for PMOS devices can be temporarily masked (e.g., covered) to protect such locations of channel layer 404 during the formation of source/drain region recesses 412. The mask can be any suitable material that can withstand the etch of channel layer 404 to form source/drain region recesses 412.

Figure 4E:
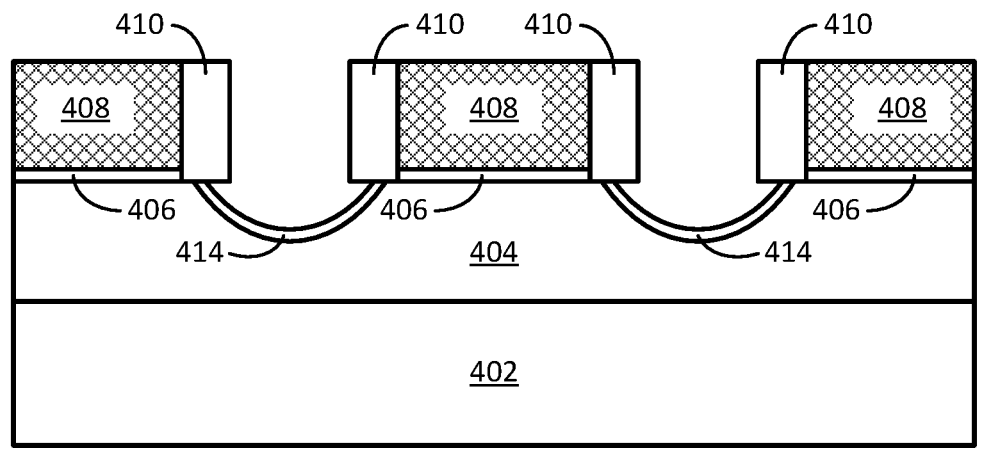
Figure 4E:
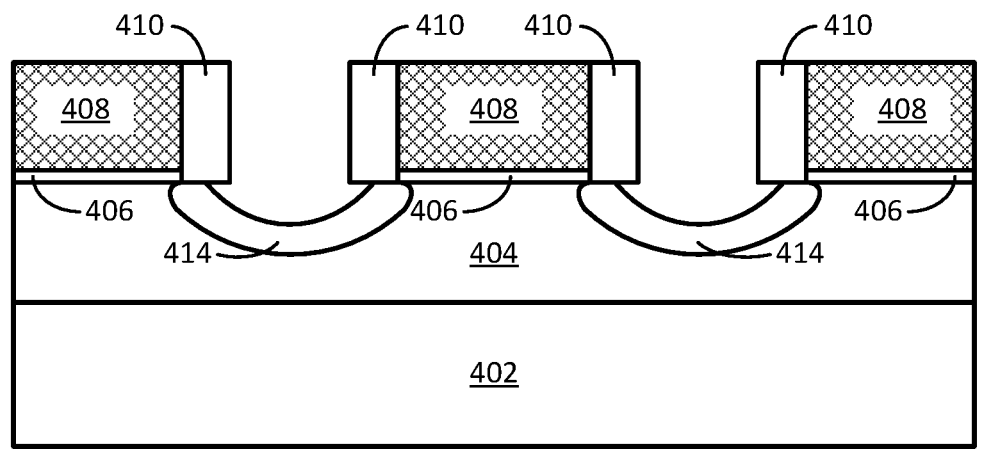
Figure 4F:
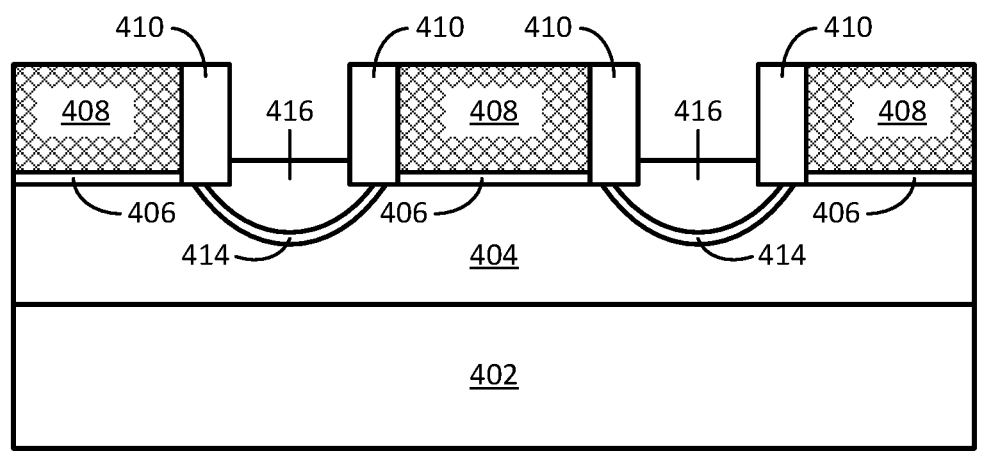
Figure 4F:
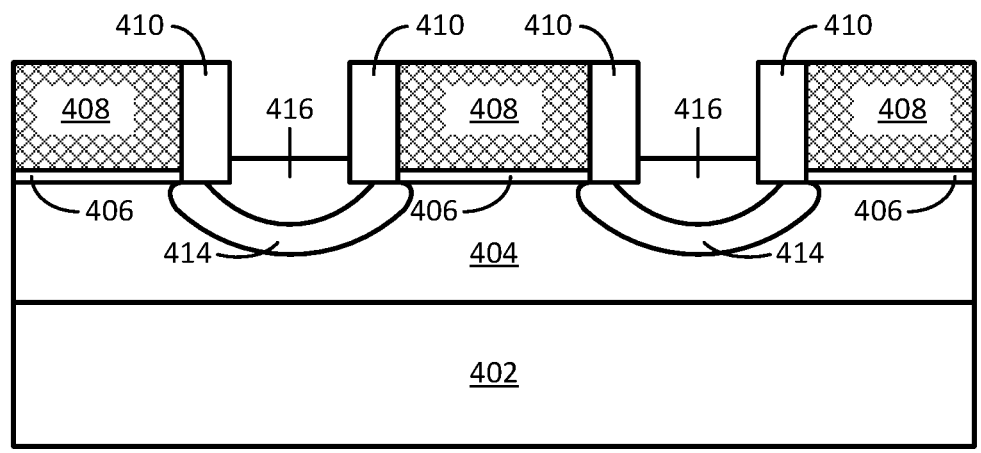

At block 310, an arsenic-doped interface layer is formed in the source/drain region recesses. FIGS. 4E and 4E' illustrate example resulting structures after formation of an example arsenic-doped interface layer 414 in each source/drain region recess 412, according to an embodiment. In some embodiments, arsenic-doped interface layer 414 is formed using an epitaxial growth process. In some embodiments, the epitaxial growth process includes a selective deposition where arsenic-doped interface layer 414 material only grows on the exposed surface of source/drain region recess 412. In any such embodiments, the arsenic can be introduced in-situ during the epitaxial growth. In some embodiments, arsenic-doped interface layer 414 includes Si:As having arsenic concentrations in a range of about 1E20 atoms per $cm^3$ to about 5E21 atoms per $cm^3$, or some other relatively high arsenic concentration based on the end use or target application. In an example embodiment, the Si:As has an arsenic concentration on the order of about 1E21 atoms per $cm^3$. For instance, the epitaxial Si:As film can be grown using suitable arsenic and silicon precursors. Examples of suitable arsenic precursors include arsine ($AsH_3$) in varying concentrations in a range of about 1 percent to 3 percent, tertiarybutylarsine ($Ch_4H_{11}As$), dichlorosilane ($H_2Cl_2Si$), tetrachlorosilane ($SiCl_4$), and hydrochloric acid (HCl), to name a few examples. Examples of suitable silicon precursors include silane ($SiH_4$), disilane ($Si_2H_6$), dichlorosilane ($H_2Cl_2Si$), tetrachlorosilane ($SiCl_4$), and hydrochloric acid (HCl), to name a few examples. The epitaxial Si:As growth conditions may include a deposition temperature in a range of about 500 degrees Celsius to about 800 degrees Celsius and a pressure in a range of about 10 Torr to about 760 Torr (atmospheric pressure), for example. Note that the upper temperature range may be limited by compatibility with the gate stack materials and gate stack processing. In such embodiments, the resulting epitaxial Si:As film can have a relatively uniform thickness in a range of about 0.5 nm to full fill. Note that the thickness need not be perfectly uniform and may vary slightly. A uniform deposition may have a small variance in thickness over the length of the layer, such as the thinnest part of the layer being within 10% of the thickest part of the layer, in accordance with an embodiment. Other embodiments may have a tighter tolerance on the layer thickness, such as a 5% or 2% tolerance between the thinnest and thickest parts. In the case of full fill, any undesired excess Si:As material may be removed (e.g., via chemical mechanical planarization, or CMP) to provide a source/drain region comprised entirely of Si:As (e.g., source/drain region comprised of an Si:As interface layer and an Si:As body).

At block 312, source/drain region bodies are formed on top of the arsenic-doped interface layers. Note that the operation of block 312 is optional in that block 312 is performed in cases of partial fill of source/drain region recesses 412 at block 310. Regardless of whether optional operation of block 312 is performed, FIGS. 4F and 4F' illustrate example resulting structures after formation of example source/drain region bodies 416 on top of source/drain interface layers 414, according to an embodiment. For instance, in cases of full fill at block 310, source/drain region body 416 material is compositionally the same as the material of arsenic-doped interface layer 414. For instance, arsenic-doped interface layer 414 and source/drain region body 416 can both comprise any of the previously described Si:As, for example. Otherwise (e.g., in cases of partial fill at block 310), Si:P is deposited onto a top surface of arsenic-doped interface layer 414 in source/drain region recesses 412 to complete the source/drain region portions above arsenic-doped interface layer 414. In some embodiments, deposition of Si:P may include any suitable deposition techniques, such as ALD, CVD, PVD, or any other suitable deposition process. Deposition of Si:P may result in excess Si:P material, and any undesired excess Si:P material may be removed (e.g., via chemical mechanical planarization, or CMP) to provide a desired source/drain region.

In some embodiments, the source/drain region includes any of the previously described silicon co-doped with arsenic and phosphorus materials. In an example embodiment, source/drain region body 416 includes silicon doped with one or more of arsenic and phosphorus. In any such embodiments, the resulting epitaxial arsenic and phosphorus doped silicon film fills source/drain region recess 412. In such cases of arsenic and phosphorus doped silicon fill, any undesired excess material may be removed (e.g., via chemical mechanical planarization, or CMP) to provide a source/drain region comprised of arsenic and phosphorus doped silicon. For instance, in an example embodiment, the arsenic and phosphorus doped silicon film comprises the source/drain region body on top of the source/drain region interface layer.

In some embodiments, the source/drain region includes any of the previously described silicon co-doped with various combinations of arsenic, phosphorus, and/or carbon. In an example embodiment, source/drain region body 416 includes silicon doped with one or more of arsenic, phosphorus, and carbon. In any such embodiments, the resulting epitaxial arsenic, phosphorus, and/or carbon doped silicon film fills source/drain region recess 412. In such cases of arsenic, phosphorus, and/or carbon doped silicon fill, any undesired excess material may be removed (e.g., via chemical mechanical planarization, or CMP) to provide a source/drain region comprised of arsenic, phosphorus, and/or carbon doped silicon. For instance, in an example embodiment, the arsenic, phosphorus, and/or carbon doped silicon film comprises the source/drain region body on top of the source/drain region interface layer.

Figure 4G:
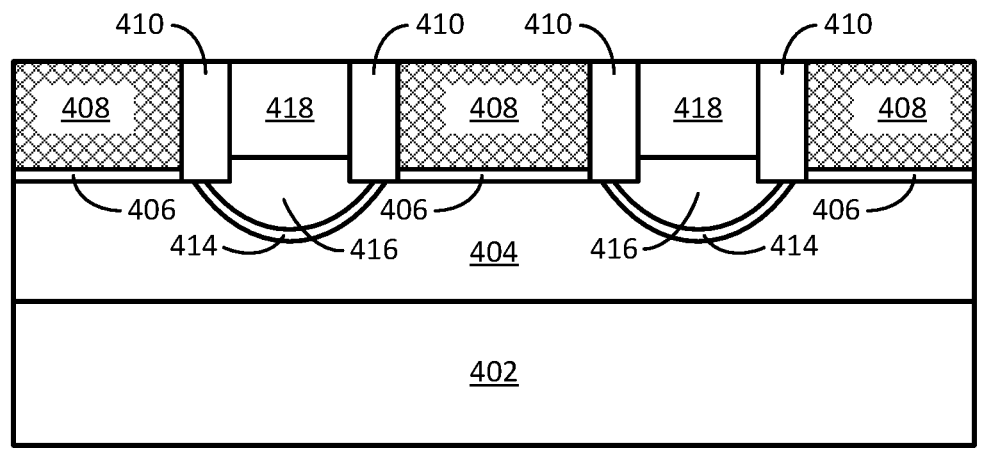
Figure 4G:
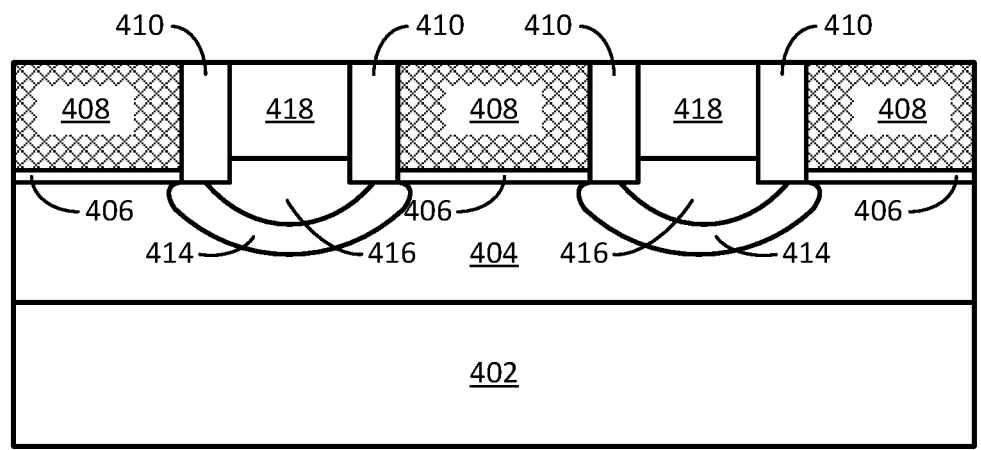

At block 314, a dielectric layer is formed over the source/drain regions. FIGS. 4G and 4G' illustrate example resulting structures after formation of example dielectric layers 418 over the source/drain regions. Dielectric layer 418, which may be considered an interlayer dielectric (ILD) layer, is formed to prepare the structure for source/drain contact processing and cover the underlying source/drain region should replacement gate processing occur, for example. For instance, dielectric layer 418 can protect the underlying source/drain region during the removal and replacement of a dummy gate structure with a final gate structure in the case of replacement gate processing.

In some embodiments, dielectric layer 418 includes any suitable oxide (e.g., silicon dioxide), nitride (e.g., silicon nitride), high-k dielectric, low-k dielectric, and/or any other suitable electrically insulating material as will be apparent in light of this disclosure. In some embodiments, dielectric layer 418 includes silicon, oxygen, nitrogen, and/or carbon. For instance, in some embodiments, dielectric layer 418 includes silicon dioxide, silicon nitride, silicon oxynitride, or carbon-doped silicon dioxide (or other carbon-doped oxides). In some embodiments, it is desired to select material for dielectric layer 418 that has a low dielectric constant and a high breakdown voltage. In some embodiments, to decrease dielectric constant, dielectric layer 418 is formed to be intentionally porous, such as including at least one porous carbon-doped oxide (e.g., porous carbon-doped silicon dioxide). In embodiments where dielectric layer 418 is porous, it includes multiple pores throughout at least a portion of dielectric layer 418. In some embodiments, dielectric layer 418 includes a multilayer structure, even though it is illustrated as a single layer in the figures. Note that dielectric layer 418 may be referred to as an interlayer dielectric (ILD) structure, in some cases.

Figure 4H:
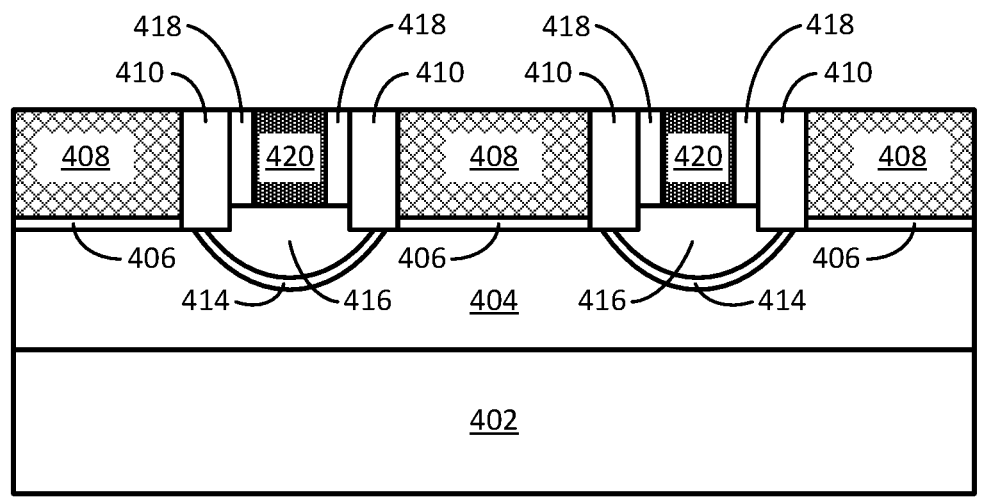
Figure 4H:
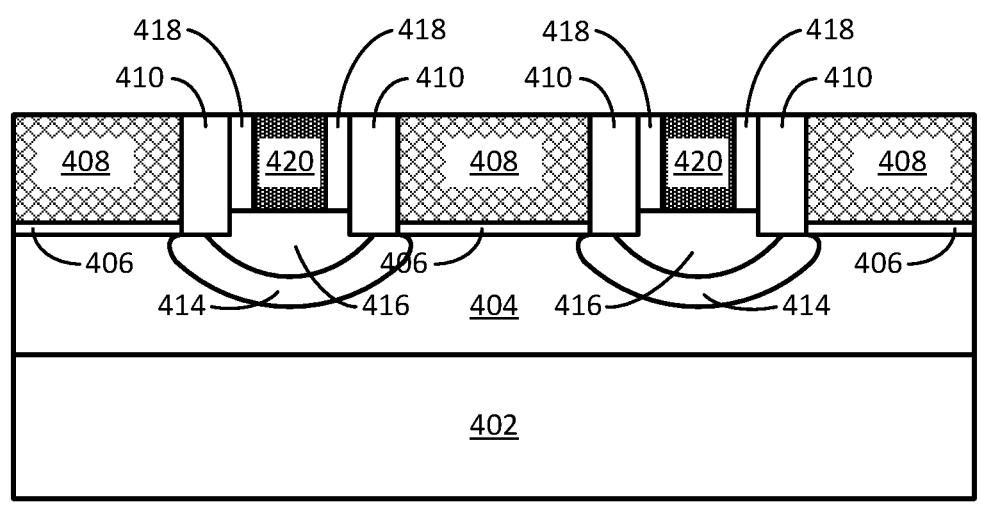

At block 316, source/drain contact structures are formed over corresponding dielectric layers. FIGS. 4H and 4H' illustrate example resulting structures after formation of example source/drain contact structures 420 over corresponding dielectric layers 418. In some embodiments, formation of source/drain contact structure 420 includes forming a source/drain contact trench in dielectric layer 418. Note that, as illustrated in FIG. 4H, dielectric layers 418 are over respective source/drain regions for NMOS devices. In some embodiments, formation of source/drain contact structures 420 includes silicidation, germanidation, and/or III-V-idation to form a mixture of one or more metals with the exposed semiconductor material surface of the source/drain regions. In some cases, the mixture of the metal and semiconductor material is referred to as an intermetallic region. In some embodiments, source/drain contact structure 420 can include a resistance reducing metal and a contact plug metal, or just a contact plug, for instance. Example contact resistance reducing metals include, for instance, nickel, titanium, titanium with nitrogen (e.g., in the form of titanium nitride), tantalum, tantalum with nitrogen (e.g., in the form of tantalum nitride), cobalt, gold, gold-germanium, nickel-platinum, nickel aluminum, and/or other such resistance reducing metals or alloys. Example contact plug metals include, for instance, aluminum, tungsten, ruthenium, or cobalt, although any suitable conductive material could be employed. In some embodiments, additional layers are present in the source/drain contact trenches, where such additional layers can be a part of source/drain contact structures 420. Examples of additional layers include adhesion layers and/or liner/barrier layers, that include, for example, titanium, titanium with nitrogen (e.g., in the form of titanium nitride), tantalum, and/or tantalum with nitrogen (e.g., in the form of tantalum nitride). Another example of an additional layer is a contact resistance reducing layer between a given source/drain region and its corresponding source/drain contact structure 420, where the contact resistance reducing layer includes semiconductor material and relatively high dopant (e.g., with dopant concentrations greater than 1E19, 1E20, 1E21, 5E21, or 1E22 atoms per cubic cm), for example. Note that, if PMOS source/drain regions exist on the substrate, contact structures similar to source/drain contact structures 420 can be formed over such PMOS source/drain regions, for instance.

At block 318, integrated circuit processing is completed, as desired. In some embodiments, such additional processing to complete the integrated circuit can include back-end or back-end-of-line (BEOL) processing to form one or more metallization layers and/or to interconnect the devices formed during the front-end or front-end-of-line (FEOL) processing, such as the transistor devices described herein. Note that blocks 302-318 of process 300 are shown in a particular order for ease of description, in accordance with some embodiments. However, one or more of blocks 302-318 can be performed in a different order or need not be performed at all, in other embodiments. For example, the outlined actions and operations are only provided as examples, and some of the actions and operations may be optional, combined into fewer actions and operations, or expanded into additional actions and operations without detracting from the essence of the disclosed embodiments. Numerous variations on process 300 and the techniques described herein will be apparent in light of this disclosure.

Example System

Figure 5:
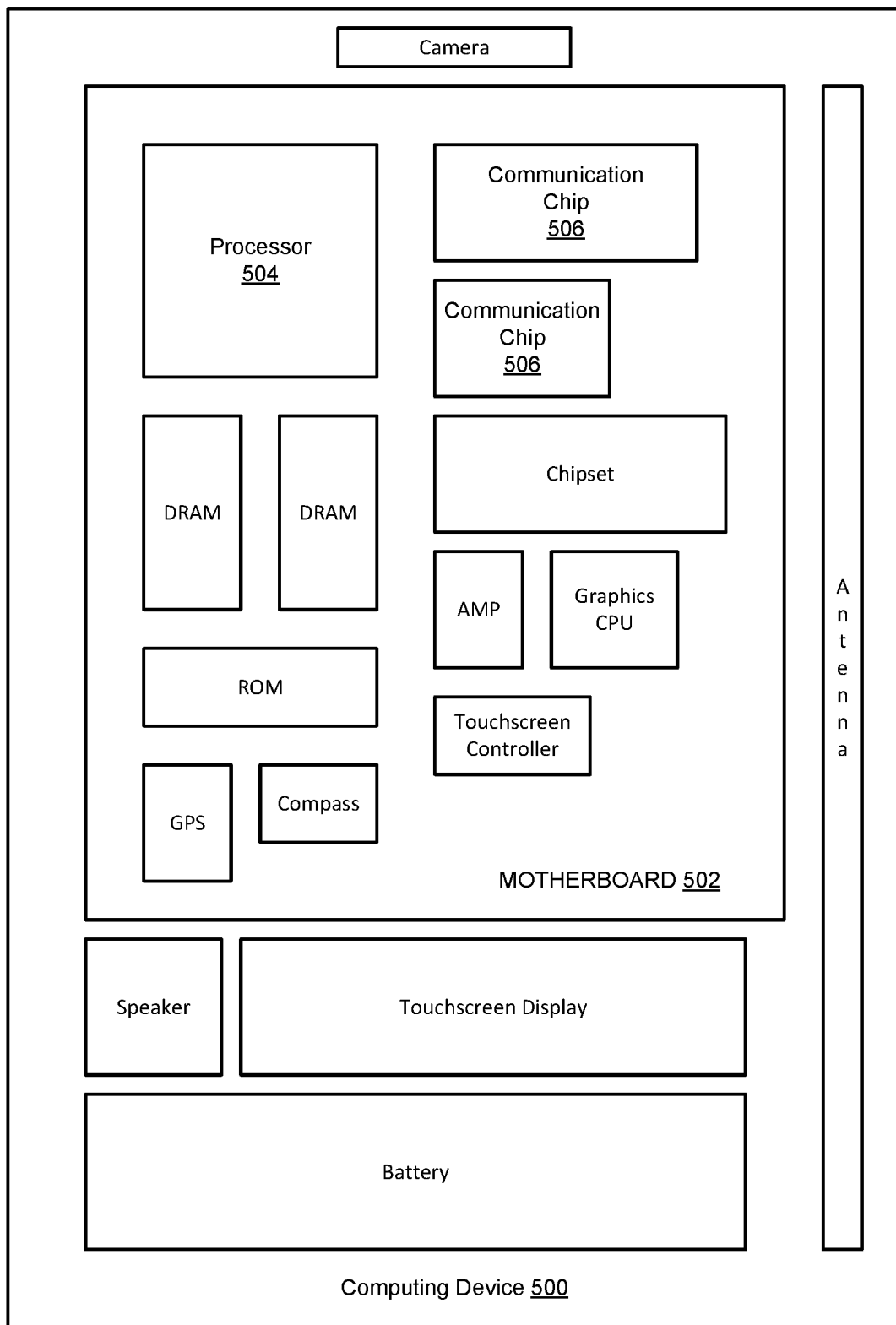
FIG. 5 is an example computing system implemented with one or more of the integrated circuit structures as disclosed herein, in accordance with an embodiment of the present disclosure.

FIG. 5 is an example computing system 500 implemented with one or more of the integrated circuit structures as disclosed herein, in accordance with an embodiment of the present disclosure. As can be seen, computing system 500 houses a motherboard 502. Motherboard 502 may include a number of components, including, but not limited to, a processor 504 and at least one communication chip 506, each of which can be physically and electrically coupled to motherboard 502, or otherwise integrated therein. As will be appreciated, motherboard 502 may be, for example, any printed circuit board, whether a main board, a daughterboard mounted on a main board, or the only board of system 500, etc.

Depending on its applications, computing system 500 may include one or more other components that may or may not be physically and electrically coupled to motherboard 502. These other components may include, but are not limited to, volatile memory (e.g., DRAM), non-volatile memory (e.g., read only memory (ROM)), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 500 may include one or more integrated circuit structures or devices configured in accordance with an example embodiment (e.g., to include one or more semiconductor structures including arsenic-doped epitaxial source/drain regions, as variously provided herein). In some embodiments, multiple functions can be integrated into one or more chips (e.g., for instance, note that communication chip 506 can be part of or otherwise integrated into processor 504).

Communication chip 506 enables wireless communications for the transfer of data to and from computing system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 506 may implement any of a number of wireless standards or protocols, including, but not limited to, Wi-Fi (Institute of Electrical and Electronics Engineers (IEEE) 802.11 family), worldwide interoperability for microwave access (WiMAX) (IEEE 802.16 family), IEEE 802.20, long term evolution (LTE), 1x evolution-data optimized (Ev-DO), high speed packet access (HSPA+), high speed downlink packet access (HSDPA+), high speed uplink packet access (HSUPA+), enhanced data rates for GSM evolution (EDGE), global system for mobile communication (GSM), general packet radio service (GPRS), code division multiple access (CDMA), time division multiple access (TDMA), digital enhanced cordless telecommunications (DECT), Bluetooth, derivatives thereof, as well as any other wireless protocols that are designated as 3G, 4G, 5G, and beyond. Computing system 500 may include multiple communication chips 506. For instance, a first communication chip 506 may be dedicated to shorter range wireless communications such as Wi-Fi and Bluetooth, and a second communication chip 506 may be dedicated to longer range wireless communications such as GPS, EDGE, GPRS, CDMA, WiMAX, LTE, Ev-DO, and others. In some embodiments, communication chip 506 may include one or more semiconductor structures including arsenic-doped epitaxial source/drain region architecture as variously described herein.

Processor 504 of computing system 500 includes an integrated circuit die packaged within processor 504. In some embodiments, the integrated circuit die of the processor includes onboard circuitry that is implemented with one or more integrated circuit structures or devices having arsenic-doped epitaxial source/drain regions as variously described herein. The term "processor" may refer to any device or portion of a device that processes, for instance, electronic data from registers and/or memory to transform that electronic data into other electronic data that may be stored in registers and/or memory.

Communication chip 506 also may include an integrated circuit die packaged within communication chip 506. In accordance with some such example embodiments, the integrated circuit die of the communication chip includes one or more integrated circuit structures or devices having arsenic-doped epitaxial source/drain regions as variously described herein. As will be appreciated in light of this disclosure, note that multi-standard wireless capability may be integrated directly into processor 504 (e.g., where functionality of any chips 506 is integrated into processor 504, rather than having separate communication chips). Further note that processor 504 may be a chip set having such wireless capability. In short, any number of processor 504 and/or communication chips 506 can be used. Likewise, any one chip or chip set can have multiple functions integrated therein.

In various implementations, computing system 500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 includes an integrated circuit structure including: a substrate; a gate structure over the substrate, the gate structure being part of an NMOS transistor device; and a source region and a drain region to respective sides of the gate structure, the source region and the drain region each including an arsenic-doped interface layer and a body, wherein the arsenic-doped interface layer of the source region is between the body of the source region and a channel region, and wherein the arsenic-doped interface layer of the drain region is between the body of the drain region and the channel region.

Example 2 includes the subject matter of Example 1, wherein the substrate is a bulk silicon substrate.

Example 3 includes the subject matter of any of Examples 1 and 3, wherein the source region includes an undercut such that the source region extends under the gate structure.

Example 4 includes the subject matter of any of Examples 1 through 3, wherein the drain region includes an undercut such that the source region extends under the gate structure.

Example 5 includes the subject matter of any of Examples 1 through 4, wherein the arsenic-doped interface layer is conformal.

Example 6 includes the subject matter of any of Examples 1 through 5, wherein the arsenic-doped interface layer includes an arsenic concentration in a range of 1E20 atoms per $cm^3$ to 5E21 atoms per $cm^3$.

Example 7 includes the subject matter of any of Examples 1 through 6, wherein the arsenic-doped interface layer includes arsenic-doped silicon comprising an arsenic concentration of 1E21 atoms per $cm^3$, or higher.

Example 8 includes the subject matter of any of Examples 1 through 7, wherein the arsenic-doped interface layer has a thickness in a range of 0.5 nm to 25 nm.

Example 9 includes the subject matter of any of Examples 1 through 8, wherein the arsenic-doped interface layer and the body include arsenic-doped silicon comprising an arsenic concentration in a range of 1E20 atoms per $cm^3$ to 5E21 atoms per $cm^3$.

Example 10 includes the subject matter of any of Examples 1 through 9, wherein the arsenic-doped interface layer and the body include arsenic-doped silicon comprising an arsenic concentration of 1E21 atoms per $cm^3$, or higher.

Example 11 includes the subject matter of any of Examples 1 through 10, wherein the arsenic-doped interface layer and the body include silicon co-doped with arsenic and phosphorus, such that the arsenic-doped interface layer is doped with arsenic and the body is doped with phosphorus.

Example 12 includes the subject matter of Example 11, wherein the arsenic-doped interface layer inhibits the phosphorus from migrating into the channel region under the gate structure.

Example 13 includes the subject matter of any of Examples 1 through 12, wherein the body includes silicon doped with one or more of arsenic, phosphorus, and carbon.

Example 14 includes the subject matter of any of Examples 1 through 13, wherein the NMOS transistor device has a planar transistor configuration.

Example 15 includes the subject matter of any of Examples 1 through 13, wherein the NMOS transistor device has a non-planar transistor configuration.

Example 16 includes the subject matter of Example 15, wherein the non-planar transistor configuration includes a fin structure under the gate structure, and the gate structure is on multiple sides of the fin structure.

Example 17 includes the subject matter of Example 15, wherein the non-planar transistor configuration includes a nanowire and/or nanoribbon under the gate structure, and the gate structure wraps around the nanowire and/or nanoribbon.

Example 18 includes an integrated circuit structure including: a bulk silicon substrate; a gate structure over the bulk silicon substrate, the gate structure being part of an NMOS transistor device; and a source region and a drain region to respective sides of the gate structure, the source region and the drain region each being a bi-layer structure including a first layer and a second layer, wherein the first layer includes an arsenic concentration in a range of 1E20 atoms per $cm^3$ to 5E21 atoms per $cm^3$, and the second layer includes semiconductor fill.

Example 19 includes the subject matter of Example 18, wherein one or both the source region and the drain region includes a tip region that extends under the gate structure, and the first layer is in the tip region.

Example 20 includes the subject matter of any of Examples 18 and 19, wherein the first layer is conformal and has a thickness in a range of 0.5 nm to 25 nm.

Example 21 includes the subject matter of any of Examples 18 through 20, wherein the first layer has a thickness of at least 0.5 nm.

Example 22 includes the subject matter of any of Examples 18 through 21, wherein the first layer comprises an arsenic concentration of 1E21 atoms per cm$^3$, or higher.

Example 23 includes the subject matter of any of Examples 18 through 22, wherein the first layer and the second layer include a compositionally same material.

Example 24 includes the subject matter of Example 23, wherein the compositionally same material is silicon, and the second layer is doped with arsenic, phosphorus, and/or carbon.

Example 25 includes the subject matter of Example 24, wherein the second layer comprises a carbon concentration in a range of 0.05 atomic percent to 3 atomic percent.

Example 26 includes the subject matter of any of Examples 18 through 25, wherein the first layer inhibits the phosphorus from migrating into a channel region under the gate structure.

Example 27 includes the subject matter of any of Examples 18 through 26, wherein the body includes silicon doped with one or more of arsenic, phosphorus, and carbon.

Example 28 includes the subject matter of any of Examples 18 through 27, wherein the NMOS transistor device has a planar transistor configuration.

Example 29 includes the subject matter of any of Examples 18 through 27, wherein the NMOS transistor device has a non-planar transistor configuration.

Example 30 includes the subject matter of Example 29, wherein the non-planar transistor configuration includes a fin structure under the gate structure, and the gate structure is on multiple sides of the fin structure.

Example 31 includes the subject matter of Example 29, wherein the non-planar transistor configuration includes a nanowire and/or nanoribbon under the gate structure, and the gate structure wraps around the nanowire and/or nanoribbon.

Example 32 includes a method for forming an integrated circuit structure, the method including: forming gate structure over a substrate, the gate structure being part of an NMOS transistor device; forming a source region recess and a drain region recess to respective sides of the gate structure; depositing an arsenic-doped interface layer in the source region recess and the drain region recess, the arsenic-doped interface layer including an arsenic concentration in a range of 1E20 atoms per cm$^3$ to 5E21 atoms per cm$^3$; forming a source region body on top of the arsenic-doped interface layer at least partially in the source region recess; and forming a drain region body on top of the arsenic-doped interface layer at least partially in the drain region recess.

Example 33 includes the subject matter of Example 32, wherein the arsenic-doped interface layer further comprises silicon.

Example 34 includes the subject matter of any of Examples 32 and 33, wherein the source region body comprises an n-type impurity.

Example 35 includes the subject matter of any of Examples 32 through 34, wherein the substrate is a bulk silicon substrate.

Example 36 includes the subject matter of any of Examples 32 through 35, wherein the source region recess includes an undercut such that the source region recess extends under the gate structure.

Example 37 includes the subject matter of any of Examples 32 through 36, wherein the drain region recess includes an undercut such that the drain region recess extends under the gate structure.

Example 38 includes the subject matter of any of Examples 32 through 37, wherein the arsenic-doped interface layer is conformal.

Example 39 includes the subject matter of any of Examples 32 through 38, wherein the arsenic-doped interface layer includes an arsenic concentration in a range of 1E20 atoms per cm$^3$ to 5E21 atoms per cm$^3$.

Example 40 includes the subject matter of any of Examples 32 through 39, wherein the arsenic-doped interface layer includes arsenic-doped silicon comprising an arsenic concentration of 1E21 atoms per cm$^3$, or higher.

Example 41 includes the subject matter of any of Examples 32 through 40, wherein the arsenic-doped interface layer has a thickness in a range of 0.5 nm to 25 nm.

Example 42 includes the subject matter of any of Examples 32 through 41, wherein the arsenic-doped interface layer, the source region body, and the drain region body include arsenic-doped silicon comprising an arsenic concentration in a range of 1E20 atoms per cm$^3$ to 5E21 atoms per cm$^3$.

Example 43 includes the subject matter of any of Examples 32 through 42, wherein the arsenic-doped interface layer, the source region body, and the drain region body include arsenic-doped silicon comprising an arsenic concentration of 1E21 atoms per cm$^3$, or higher.

Example 43 includes the subject matter of any of Examples 32 through 42, wherein the arsenic-doped interface layer includes silicon doped with arsenic, and the source region body and the drain region body include silicon doped with phosphorus.

Example 44 includes the subject matter of Examples 43, wherein the arsenic-doped interface layer inhibits the phosphorus from migrating into a channel region under the gate structure.

Example 45 includes the subject matter of any of Examples 32 through 44, wherein the source region body and the drain region body include silicon doped with one or more of arsenic, phosphorus, and carbon.

Example 46 includes the subject matter of any of Examples 32 through 45, wherein the NMOS transistor device has a planar transistor configuration.

Example 47 includes the subject matter of any of Examples 32 through 45, wherein the NMOS transistor device has a non-planar transistor configuration.

Example 48 includes the subject matter of Example 47, wherein the non-planar transistor configuration includes a fin structure under the gate structure, and the gate structure is on multiple sides of the fin structure.

Example 49 includes the subject matter of Example 47, wherein the non-planar transistor configuration includes a nanowire and/or nanoribbon under the gate structure, and the gate structure wraps around the nanowire and/or nanoribbon.

Terms used in the present disclosure and in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

All examples and conditional language recited in the present disclosure are intended for pedagogical examples to aid the reader in understanding the present disclosure, and are to be construed as being without limitation to such specifically recited examples and conditions. Although embodiments of the present disclosure have been described in detail, various changes, substitutions, and alterations could be made hereto without departing from the spirit and scope of the present disclosure. Accordingly, it is intended that the scope of the present disclosure be limited not by this detailed description, but rather by the claims appended hereto.

What is claimed is:

1. An integrated circuit structure, comprising:
a substrate;
a gate structure over the substrate, the gate structure being part of an NMOS transistor device; and
a source region and a drain region to respective sides of the gate structure, the source region and the drain region each including an arsenic-doped interface layer and a body, wherein the arsenic-doped interface layer of the source region is between the body of the source region and a channel region, wherein the arsenic-doped interface layer of the drain region is between the body of the drain region and the channel region, wherein the arsenic-doped interface layer of the source region completely separates the body of the source region from the substrate and the channel region, and wherein the arsenic-doped interface layer of the drain region completely separates the body of the drain region from the substrate and the channel region.

2. The integrated circuit structure of claim 1, wherein the substrate is a bulk silicon substrate.

3. The integrated circuit structure of claim 1, wherein the source region includes an undercut such that the source region extends under the gate structure and the drain region includes an undercut such that the source region extends under the gate structure.

4. The integrated circuit structure of claim 1, wherein the arsenic-doped interface layer is conformal.

5. The integrated circuit structure of claim 1, wherein the arsenic-doped interface layer includes an arsenic concentration in a range of 1E20 atoms per cm.sup.3 to 5E21 atoms per cm.sup.3.

6. The integrated circuit structure of claim 1, wherein the arsenic-doped interface layer includes arsenic-doped silicon comprising an arsenic concentration of 1E21 atoms per cm.sup.3, or higher.

7. The integrated circuit structure of claim 1, wherein the arsenic-doped interface layer has a thickness in a range of 0.5 nm to 25 nm.

8. The integrated circuit structure of claim 1, wherein the arsenic-doped interface layer and the body include arsenic-doped silicon comprising an arsenic concentration in a range of 1E20 atoms per $cm^3$ to 5E21 atoms per $cm^3$.

9. The integrated circuit structure of claim 1, wherein the arsenic-doped interface layer and the body include silicon co-doped with arsenic and phosphorus, such that the arsenic-doped interface layer is doped with arsenic and the body is doped with phosphorus.

10. The integrated circuit structure of claim 9, wherein the arsenic-doped interface layer inhibits the phosphorus from migrating into the channel region under the gate structure.

11. The integrated circuit structure of claim 1, wherein the body includes silicon doped with one or more of arsenic, phosphorus, and carbon.

12. The integrated circuit structure of claim 1, wherein the NMOS transistor device has a planar transistor configuration.

13. The integrated circuit structure of claim 1, wherein the NMOS transistor device has a non-planar transistor configuration.

14. The integrated circuit structure of claim 13, wherein the non-planar transistor configuration includes a fin structure under the gate structure, and the gate structure is on multiple sides of the fin structure.

15. The integrated circuit structure of claim 13, wherein the non-planar transistor configuration includes a nanowire and/or nanoribbon under the gate structure, and the gate structure wraps around the nanowire and/or nanoribbon.

* * * * *